(12) United States Patent
Hasegawa

(10) Patent No.: US 9,111,826 B2
(45) Date of Patent: Aug. 18, 2015

(54) IMAGE PICKUP DEVICE, IMAGE PICKUP MODULE, AND CAMERA

(75) Inventor: Shin Hasegawa, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 359 days.

(21) Appl. No.: 13/817,755

(22) PCT Filed: Aug. 5, 2011

(86) PCT No.: PCT/JP2011/004452
§ 371 (c)(1),
(2), (4) Date: Feb. 19, 2013

(87) PCT Pub. No.: WO2012/026074
PCT Pub. Date: Mar. 1, 2012

(65) Prior Publication Data
US 2013/0141626 A1    Jun. 6, 2013

(30) Foreign Application Priority Data

Aug. 23, 2010    (JP) ................................. 2010-186070

(51) Int. Cl.
*H01L 27/146* (2006.01)
*H04N 5/335* (2011.01)
*H01L 23/31* (2006.01)

(52) U.S. Cl.
CPC .......... *H01L 27/14618* (2013.01); *H04N 5/335* (2013.01); *H01L 23/3128* (2013.01); *H01L 2924/0002* (2013.01)

(58) Field of Classification Search
CPC ................... H04N 5/2254; H01L 2924/01079; H01L 27/1203; H01H 59/0009; G01P 15/0802
USPC .......................................................... 348/340
See application file for complete search history.

(56) References Cited

U.S. PATENT DOCUMENTS

| 2005/0073017 | A1* | 4/2005 | Kim | 257/433 |
| 2005/0161805 | A1* | 7/2005 | Ono et al. | 257/704 |
| 2007/0262381 | A1 | 11/2007 | Kojima | |
| 2009/0096051 | A1* | 4/2009 | Sugiyama et al. | 257/435 |
| 2009/0283847 | A1* | 11/2009 | Kawasaki et al. | 257/432 |

(Continued)

FOREIGN PATENT DOCUMENTS

| CN | 101325208 A | 12/2008 |
| JP | 2001-351997 A | 12/2001 |

(Continued)

*Primary Examiner* — Roberto Velez
*Assistant Examiner* — Cynthia Segura
(74) *Attorney, Agent, or Firm* — Canon USA Inc IP Division

(57) ABSTRACT

An image pickup device includes a transparent member, an image pickup element chip including a photodiode, and a fixing member arranged around the image pickup element chip, a space being surrounded by the transparent member, the image pickup element chip, and the fixing member. The image pickup element chip includes a semiconductor substrate including a penetrating electrode penetrating through a first main face of the semiconductor substrate on a side of the transparent member and a second main face of the semiconductor substrate opposite the first main face. In an orthogonal projection with respect to the transparent member, the penetrating electrode is arranged in a fixing area corresponding to the fixing member, and a boundary with an area where the thickness of the semiconductor substrate is smaller than that of the semiconductor substrate in a first area corresponding to the space is arranged within the fixing area.

13 Claims, 8 Drawing Sheets

(56) References Cited

U.S. PATENT DOCUMENTS

| | | | |
|---|---|---|---|
| 2009/0284631 A1* | 11/2009 | Matsuo et al. | 348/294 |
| 2009/0295979 A1* | 12/2009 | Matsuo et al. | 348/335 |
| 2010/0207224 A1* | 8/2010 | Saito et al. | 257/432 |
| 2010/0226633 A1* | 9/2010 | Shiung et al. | 396/80 |
| 2010/0295178 A1* | 11/2010 | Ishihara et al. | 257/737 |
| 2010/0309368 A1* | 12/2010 | Choi et al. | 348/360 |
| 2011/0096213 A1* | 4/2011 | Hasegawa | 348/294 |
| 2012/0044415 A1* | 2/2012 | Tsuduki et al. | 348/374 |

FOREIGN PATENT DOCUMENTS

| | | |
|---|---|---|
| JP | 2007-305804 A | 11/2007 |
| JP | 2009-158863 A | 7/2009 |
| JP | 2010-050260 A | 3/2010 |
| JP | 2010-067872 A | 3/2010 |

\* cited by examiner

IMAGE PICKUP DEVICE, IMAGE PICKUP MODULE, AND CAMERA

TECHNICAL FIELD

The present invention relates to an image pickup device, an image pickup module, and a camera.

BACKGROUND ART

A wafer-level chip size packaging (WL-CSP) technology in which a semiconductor substrate, which includes an image pickup element and a penetrating electrode, and a light-transmission support substrate are fixed together using an adhesive so as to form a space above the image pickup element is known as a technology used for image pickup devices (see PTL 1 and PTL 2). In the existing circumstances, only relatively small-sized image pickup devices, that is, image sensors, adopting WL-CSP to be used for cellular phones or the like are available. The image pickup devices disclosed in PTL 1 and PTL 2 have a configuration in which the thickness of a semiconductor substrate below a space when viewed from a light-transmission support substrate is greater than the thickness of the semiconductor substrate below an adhesive.

CITATION LIST

Patent Literature

PTL 1: Japanese Patent Laid-Open No. 2009-158863
PTL 2: Japanese Patent Laid-Open No. 2010-050260

Small-sized image pickup devices are used for cellular phones. Reductions in size and thickness are also required for image pickup devices of a larger size, such as single-lens reflex cameras.

In order to form a penetrating electrode, which is one way to reduce the size of an image pickup device, it is necessary to reduce the thickness of a silicon substrate. However, when the size of the image pickup device increases, the intensity is decreased by reducing the size of the silicon substrate. Thus, there is a trade-off relationship in which reducing the thickness of the silicon substrate causes deformation and cracking, such as warping, of an image pickup element chip and inadequate strength of a completed chip, due to expansion of a space portion caused in a manufacturing process including heat processing, such as reflowing.

In image pickup devices adopting WL-CSP described in PTL 1 and PTL 2, since a portion where the thickness of a semiconductor substrate when viewed from a light-transmission support substrate is small is located below a space, the stress caused by deformation of the semiconductor substrate is concentrated at the portion where the thickness of the semiconductor substrate is small. Therefore, the semiconductor substrate is likely to be deformed or cracked. Thus, there is a possibility of the reliability of the image pickup device being reduced.

SUMMARY OF INVENTION

Technical Problem

The present invention provides an image pickup device and an image pickup system that exhibit a high reliability and for which there is a reduced possibility of deformation and cracking of a semiconductor substrate.

Solution to Problem

An image pickup device according to an aspect of the present invention includes a transparent member, an image pickup element chip including a photodiode, and a fixing member that is arranged around the image pickup element chip, a space being surrounded by the transparent member, the image pickup element chip, and the fixing member. The image pickup element chip includes a semiconductor substrate, and the semiconductor substrate includes a penetrating electrode that penetrates through a first main face of the semiconductor substrate on a side of the transparent member and a second main face of the semiconductor substrate opposite the first main face. In an orthogonal projection that is orthogonal with respect to the transparent member, the penetrating electrode is arranged in a fixing area corresponding to the fixing member, and a boundary with an area in which the thickness of the semiconductor substrate is smaller than the thickness of the semiconductor substrate in a first area corresponding to the space is arranged within the fixing area.

Advantageous Effects of Invention

According to the present invention, an image pickup device and an image pickup system that exhibit a high reliability and for which there is a reduced possibility of deformation and cracking of a semiconductor substrate can be provided.

DESCRIPTION OF EMBODIMENTS

Figure 1:
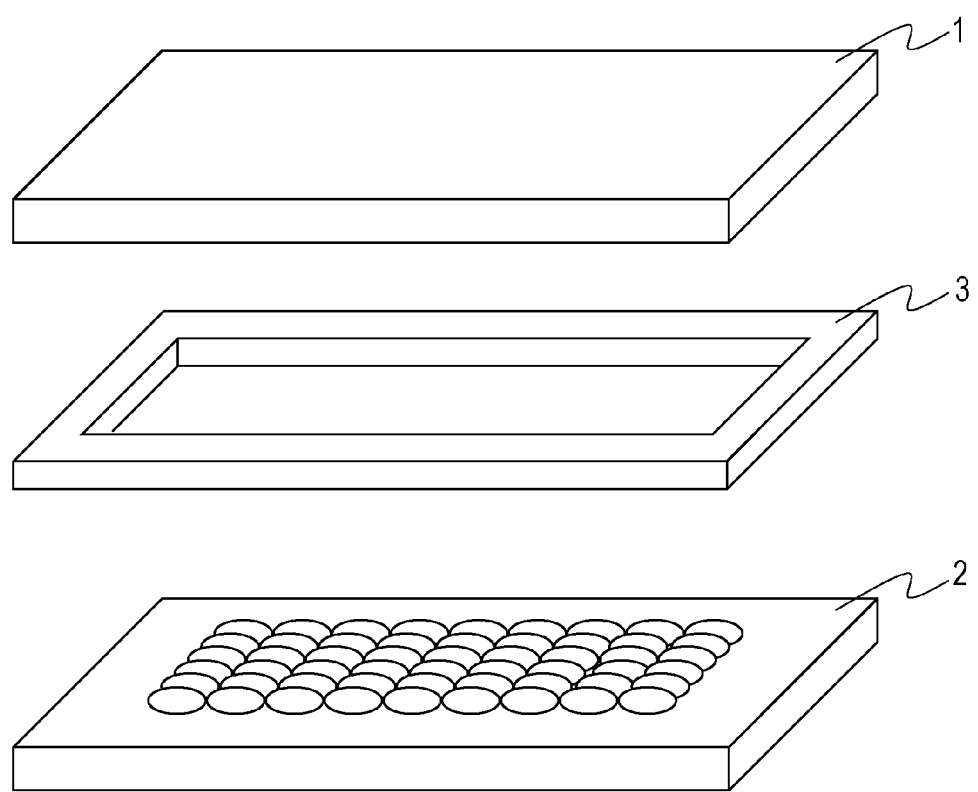
FIG. 1 is an exploded perspective view of an image pickup device according to a first embodiment.

Embodiments of the present invention will be described below with reference to FIGS. 1 to 9.
First Embodiment
FIG. 1 is an exploded perspective view of an image pickup device according to a first embodiment. The image pickup device includes a transparent member 1, an image pickup element chip 2, and a fixing member 3 arranged between the transparent member 1 and the image pickup element chip 2.

The transparent member 1 is optically transparent and is made of glass, resin, or the like. In a case where a semiconductor substrate used for the image pickup element chip 2 is made of silicon, it is desirable that the glass used for the transparent member 1 be BOROFLOAT (registered trademark) manufactured by SCHOTT AG, PYREX (registered trademark) manufactured by Corning Incorporated, an SW glass substrate manufactured by ASAHI GLASS CO., LTD, or the like. In addition, the resin used for the transparent member 1 may be made of optical plastic formed of a polycarbonate resin or the like. Such a transparent member made of glass or resin is a desirable material since glass and resin each have a coefficient of linear expansion close to that of silicon. In many cases, a silicon substrate is used for the image pickup element chip 2. In addition, it is desirable that a microlens be arranged on a light incident side of the image pickup element chip 2. In order to fix the transparent member 1 and the image pickup element chip 2 to each other, an adhesive is used for the fixing member 3. The fixing member 3 may be made of an organic resin or the like. The adhesive is formed, for example, by being patterned, on at least one of a surface of the transparent member 1 and a surface of the image pickup element chip 2.

Figure 2A:
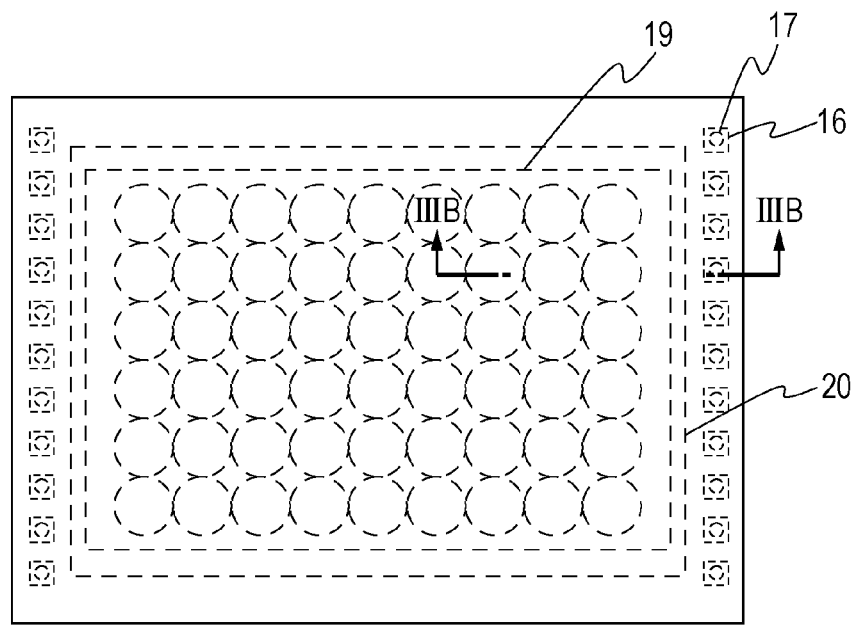
FIG. 2A is a plan view of the image pickup device according to the first embodiment.
Figure 2B:
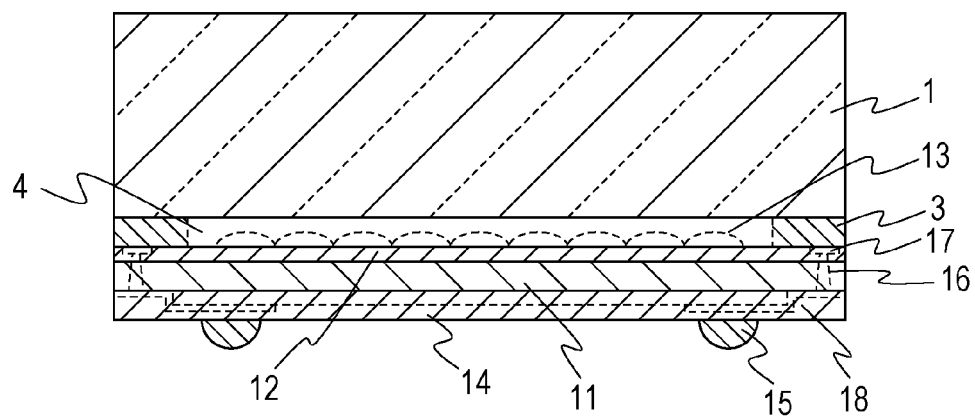
FIG. 2B is a front view of the image pickup device according to the first embodiment.

FIG. 2A is a plan view of the image pickup device according to the first embodiment. FIG. 2B is a front view of the image pickup device according to the first embodiment. The transparent member 1 and the image pickup element chip 2 are fixed to each other by the fixing member 3. A space 4 is formed by being surrounded by the transparent member 1, the image pickup element chip 2, and the fixing member 3. The image pickup element chip 2 includes a semiconductor substrate 11, a wiring structure 12 formed on the semiconductor substrate 11, and a microlens 13. For example, the semiconductor substrate 11 is made of a silicon substrate. The image pickup element chip 2 also includes an insulating member 14 and a soldering ball 15 below the semiconductor substrate 11 (on a side opposite a light incident side of the semiconductor substrate 11). The image pickup element chip 2 also includes a penetrating electrode 16 that penetrates through a first main face on a side of the transparent member 1, which is a light incident side of the semiconductor substrate 11, and a second main face that is opposite the first main face. The penetrating electrode 16 is electrically connected to an internal electrode 17 arranged within the wiring structure 12. The penetrating electrode 16 includes an electroconductive film 18 and thus is electrically connected to the soldering ball 15. A planarizing film and a color filter, which are not illustrated, are arranged between the wiring structure 12 and the microlens 13. In a case where the image pickup device is viewed from the light incident side, that is, the image pickup device is viewed from the front side as illustrated in FIG. 2B, an area in which the fixing member 3 is arranged is defined as a fixing area, which corresponds to an area more outward than an inner circumference 19 of the fixing member 3. An area more inward than the inner circumference 19 is defined as a capturing area. The capturing area contains an area in which the microlens 13 of the image pickup element chip 2 is arranged, that is, a pixel area in which a photodiode for converting incident light into electric charge is arranged. An electrode portion including the internal electrode 17, the penetrating electrode 16, and the like of the image pickup element chip 2 is arranged in the fixing area. FIG. 2B also serves as an orthogonal projection that is orthogonal with respect to the configuration of part of the transparent member 1.

Areas of the semiconductor substrate 11 have different thicknesses. A boundary 20 across which the thickness of the semiconductor substrate 11 changes is located below the fixing member 3, that is, within the area of the fixing area when viewed from the light incident side. With this configuration, compared with a known image pickup device including a semiconductor substrate in which the boundary 20 across which the thickness of the semiconductor substrate changes is located in an area more inward than the fixing area, the possibility of deformation and cracking of the semiconductor substrate 11 can be reduced. Although the boundary across which the thickness of the semiconductor substrate 11 changes may correspond to the boundary of the fixing area in the orthogonal projection that is orthogonal with respect to the transparent member 1, it is desirable that the boundary across which the thickness of the semiconductor substrate 11 changes be located within the area of the fixing area.

The required thickness of a silicon substrate used as the semiconductor substrate 11 will be explained with reference to FIG. 3.

Figure 3:
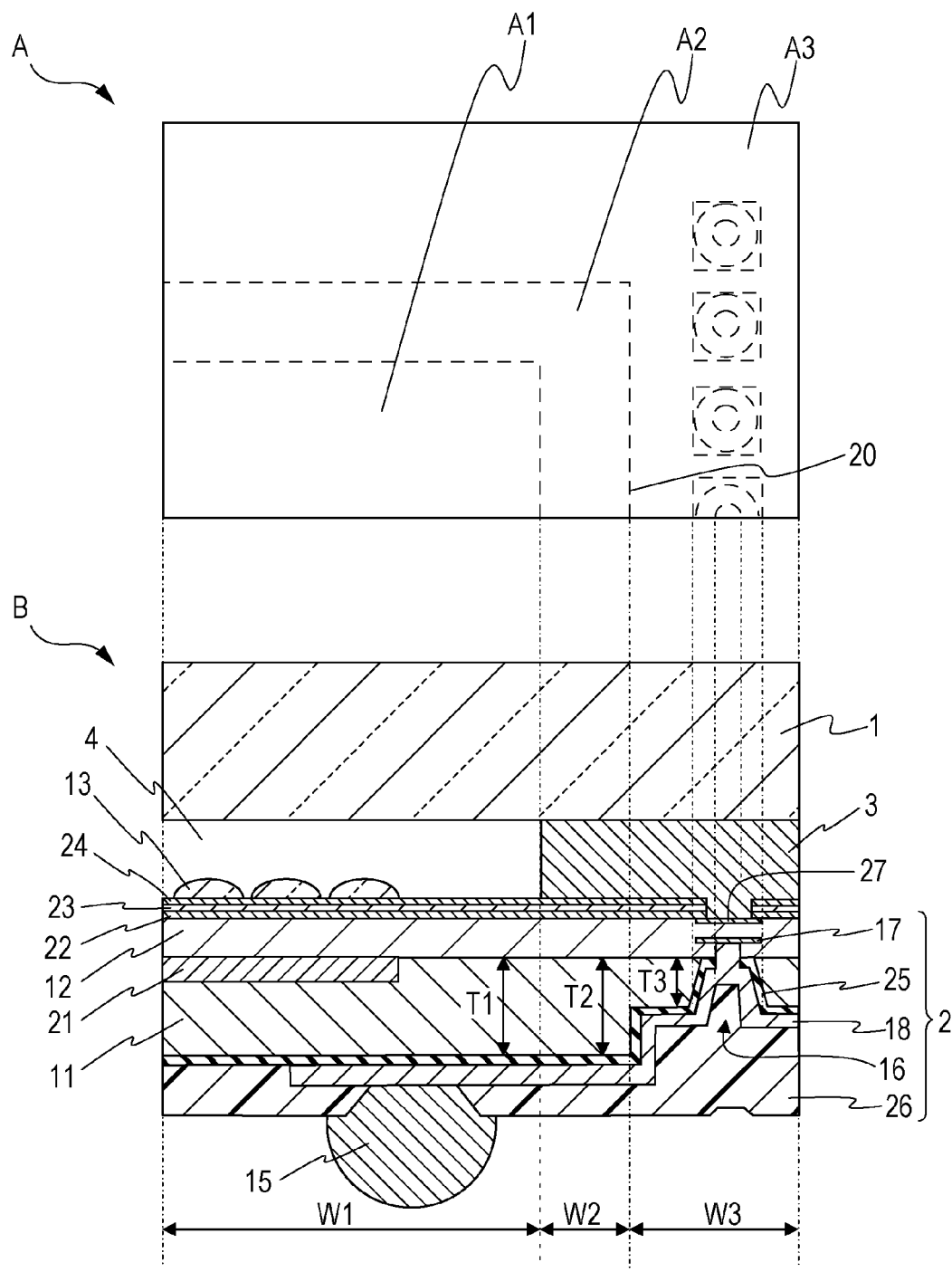
FIG. 3 includes a plan view and a sectional view of part of the image pickup device according to the first embodiment.

Part A and part B of FIG. 3 are a partial plan view and a partial sectional view of the image pickup device taken along line IIIB-IIIB of FIG. 2A.

The transparent member 1 and the image pickup element chip 2 are fixed to each other by the fixing member 3, which is arranged between the transparent member 1 and the image pickup element chip 2. The space 4 is formed by being surrounded by a surface of the image pickup element chip 2, the transparent member 1, and the fixing member 3. The image pickup device when viewed from the light incident side is categorized into a first area A1, which is a capturing area, a second area A2, which is part of a fixing area outside the first area A1, and a third area A3, which is part of the fixing area, located outside the second area A2, and is an electrode area in which a penetrating electrode is arranged. The first, second, and third areas A1 A2, and A3 have longitudinal widths of W1, W2, and W3, respectively. In the image pickup element chip 2, the first area A1 includes a pixel area 21 including a photodiode and a transistor for transferring a signal corresponding to electric charge obtained by photoelectric conversion by the photodiode, which are not illustrated. The wiring structure 12 including wiring and an inter-layer insulating film, which are not illustrated, is arranged on the first main face, which is on the light incident side of the semiconductor substrate 11. A first planarizing film 22 is arranged on the wiring structure 12. A color filter 23 is arranged on the first planarizing film 22. A second planarizing film 24 is arranged on the color filter 23. The microlens 13 is arranged on the second planarizing film 24. A through hole is formed through the semiconductor substrate 11 so as to extend from the first main face to the second main face of the semiconductor substrate 11, so that the penetrating electrode 16 is arranged. An insulating film 25 is arranged on the second main face of the semiconductor substrate 11 in which the through hole is arranged. The electroconductive film 18 is formed on the insulating film 25. A solder resist 26, which serves as a protection film, is arranged on the electroconductive film 18. An opening is formed in part of the solder resist 26 on the electroconductive film 18. The soldering ball 15 is arranged in the opening portion of the solder resist 26 on the electroconductive film 18. The transistor in the first area A1, a peripheral circuit, which is not illustrated, and the like are electrically connected to the electroconductive film 18 with the internal electrode 17 arranged in the wiring structure 12 therebetween. The penetrating electrode 16 includes the electroconductive film 18. The electroconductive film 18 may extend so as to reach a lower portion of the soldering ball 15.

An element face electrode 27 is arranged on the internal electrode 17 with the inter-layer insulating film therebetween. A contact plug, which is not illustrated, for electrically connecting the internal electrode 17 to the element face electrode 27 is arranged in the inter-layer insulating film between the internal electrode 17 and the element face electrode 27. The element face electrode 27 is used for application of voltage, reading of a signal, and the like, via the contact plug and the internal electrode 17. In particular, when a die sort test is performed, a probe is applied to the element face electrode 27. And the boundary 20 with the third area A3 in which the thickness of the semiconductor substrate is smaller than the thickness of the semiconductor substrate in the first area A1 is arranged within the fixing area.

Figure 4:
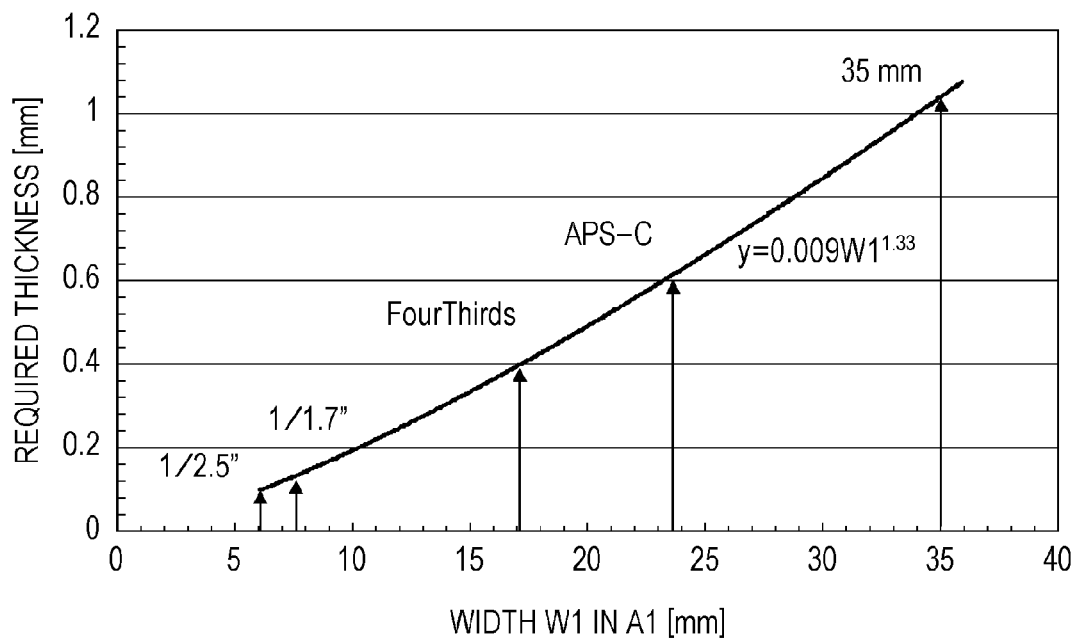
FIG. 4 is a graph illustrating the thickness of a semiconductor substrate required when the longitudinal width W1 of the semiconductor substrate in a space portion of the image pickup device according to the first embodiment is changed.

In the image pickup device having the configuration described above, the minimum values of the thicknesses T1 and T2 of the semiconductor substrate 11 in the first area A1 and the second area A2 were obtained. On the assumption that the amount of warping of a known image pickup device adopting WL-CSP is reduced to that equivalent to the amount of warping of a small-sized image pickup element chip having the size of a 1/2.5-inch chip and a thickness of 0.1 mm, the thickness of the semiconductor substrate 11 was discussed. FIG. 4 is a graph illustrating the thickness of the semiconductor substrate 11 required when the longitudinal width W1 of the space 4 is changed. The required thicknesses T1 and T2 of the semiconductor substrate 11 in the first area A1 and the second area A2 can be obtained using expression (1):

[Math.1]

$$T1, T2 \geq 0.009 W1^{1.33} \quad (1).$$

Thus, the required thicknesses T1 and T2 of the semiconductor substrate 11 in the first area A1 and the second area A2 are summarized as described below. For the case where the size of the image pickup element chip 2 corresponds to the size of a 1/2.5-inch chip, 0.1 mm or more is required. For the case where the size of the image pickup element chip 2 corresponds to the size of a Four Thirds chip, 0.4 mm or more is required. For the case where the size of the image pickup element chip 2 corresponds to the size of an APS-C chip, 0.6 mm or more is required. An image pickup element chip having a size corresponding to the size of a Four Thirds chip includes a pixel area of approximately 17.3×13 mm. An image pickup element chip having a size corresponding to the size of an APS-C chip includes a field angle of approximately 24.0×16 mm.

Figure 5:
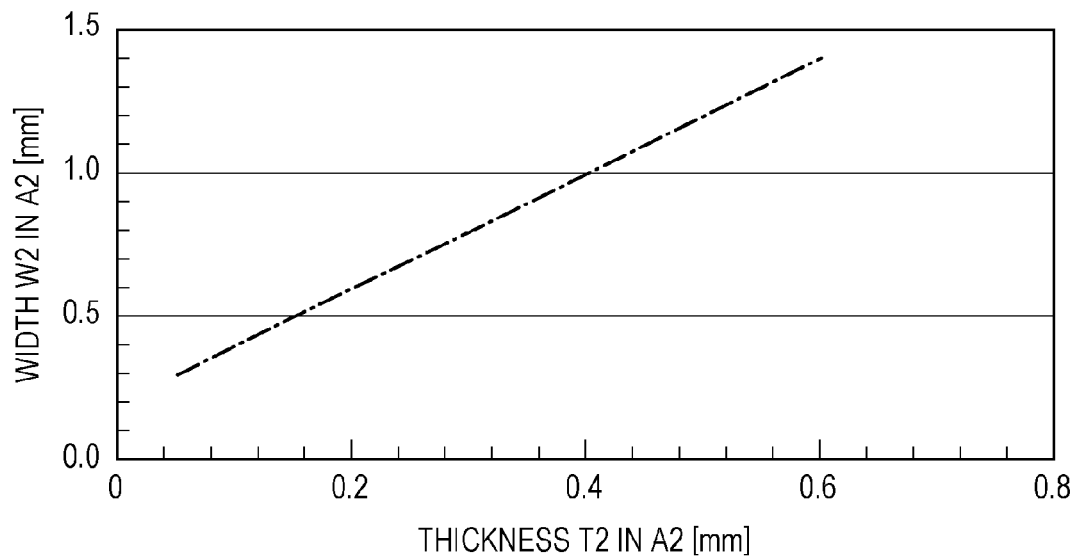
FIG. 5 is a graph illustrating the thickness of the semiconductor substrate required when the thickness T2 of the semiconductor substrate in a second area of the image pickup device according to the first embodiment is changed.

In order to suppress the reduction in the yield in a manufacturing process of the image pickup device and to reduce the influence of deformation upon an image, the thickness T2 and the width W2 of the semiconductor substrate 11 in the second area A2 required for causing the stress generated when a semiconductor substrate cracks to be reduced to one-tenth were discussed. FIG. 5 is a graph illustrating the width W2 required when the thickness T2 of the semiconductor substrate 11 in the second area A2 is changed. The width W2 required when the thickness T2 of the semiconductor substrate 11 in the second area A2 is changed can be obtained when expression (2) and (3) are consistent with each other.

[Math.2]

$$W2 \geq 0.3 \text{ mm} \quad (2)$$

[Math.3]

$$W2 \geq 2T2 + 0.2 \text{ mm} \quad (3)$$

It is desirable that the thickness T3 of the semiconductor substrate 11 in the third area A3 satisfy expression (4):

[Math.4]

$$T3 \leq T2 \quad (4).$$

In order to improve the throughput in the step of forming the penetrating electrode and to achieve an excellent quality of the insulating film and the electroconductive film formed in the through hole, it is desirable that the thickness T3 of the semiconductor substrate 11 in the third area A3 be 0.2 mm or less.

Thus, the required thickness T2 and width W2 of the semiconductor substrate 11 in the second area A2 are summarized as described below. For the case where the size of the image pickup element chip 2 corresponds to the size of a 1/2.5-inch chip, the thickness T2 is required to be 0.1 mm or more and the width W2 is required to be 0.4 mm or more. For the case where the size of the image pickup element chip 2 corresponds to the size of a Four Thirds chip, the thickness T2 is required to be 0.4 mm or more and the width W2 is required to be 1.0 mm or more. For the case where the size of the image pickup element chip 2 corresponds to the size of an APS-C chip, the thickness T2 is required to be 0.6 mm or more and the width W2 is required to be 1.4 mm or more.

The thickness of the semiconductor substrate 11 is changed by eliminating silicon when the second main face is ground or etched. Thus, each of the thicknesses T1, T2, and T3 corresponds to the distance between the second main face and the flat first main face of the semiconductor substrate 11 or a surface of the transparent member 1 on a side of the semiconductor substrate 11. Unlike the flat first main face of the semiconductor substrate 11 or the surface of the transparent member 1 on the side of the semiconductor substrate 11, the second main face of the semiconductor substrate 11 includes a recessed portion, that is, a thin portion, within the fixing area.

As described above, by arranging the boundary across which the thickness of the semiconductor substrate 11 changes within the fixing area, an image pickup device exhibiting a high reliability can be achieved. Furthermore, when the thickness T2 and the width W2 of the second area A2 and the thickness T3 of the third area A3 satisfy the relationships described above, the possibility of cracking and deformation of the semiconductor substrate 11 can be reduced, thus achieving an image pickup device exhibiting a high reliability.

A portion to be connected to the soldering ball 15 or the like may correspond to the boundary of the fixing area or be arranged within the fixing area in the orthogonal projection that is orthogonal with respect to the transparent member 1. Consequently, the possibility of deformation and cracking of the semiconductor substrate 11 can be reduced, thus achieving an image pickup device exhibiting a high reliability.

Second Embodiment

Figure 6:
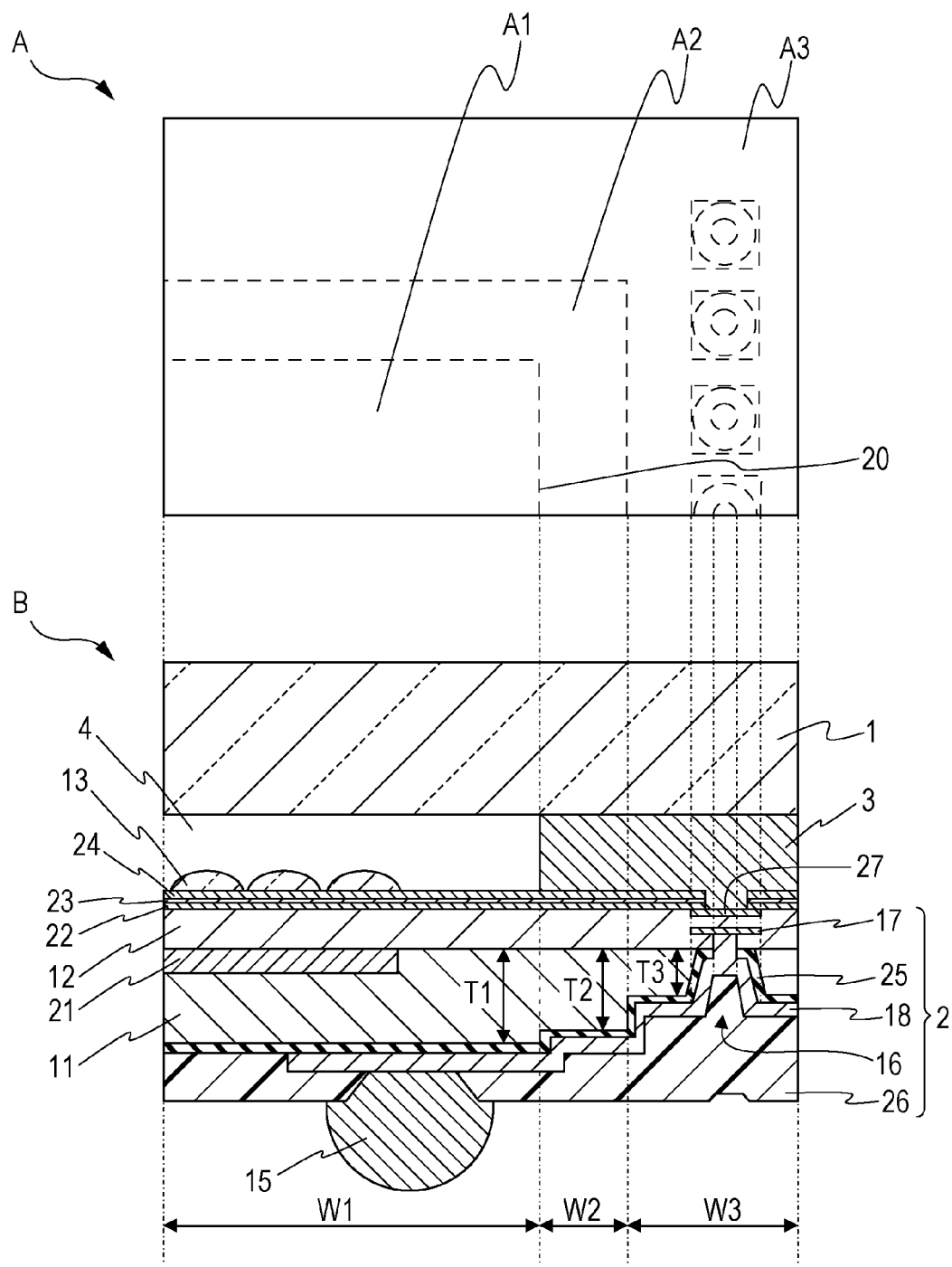
FIG. 6 includes a plan view and a sectional view of part of an image pickup device according to a second embodiment.

FIG. 6 illustrates a modification of the image pickup device according to the first embodiment. Part A and part B of FIG. 6 are a partial plan view and a partial sectional view similar to part A and part B of FIG. 3. The same components as those in FIG. 3 are referred to as the same reference numerals and signs and the explanations of those same components will be omitted.

An image pickup device according to this embodiment is characterized in that the thickness T1 of the semiconductor substrate 11 in the first area A1, the thickness T2 of the semiconductor substrate 11 in the second area A2, and the thickness T3 of the semiconductor substrate 11 in the third area A3 have the relationship T1>T2>T3. That is, the thickness T3 of the semiconductor substrate 11 in the third area A3 in which the penetrating electrode 16 is formed is smaller than the thickness T1 of the semiconductor substrate 11 in the first area A1, which is a capturing area, and the thickness T2 of the semiconductor substrate 11 in the second area A2, which is between the first area A1 and the third area A3, corresponds to the thickness between the thickness T1 and the thickness T3. Namely, the semiconductor substrate 11 has a configuration including three thicknesses. A point in that the boundary across which the thickness of the semiconductor substrate 11 changes is arranged within the fixing area in which the fixing member 3 is arranged when the image pickup device is viewed from the light incident side is the same as in the image pickup device according to the first embodiment. That is, the boundary 20 with the second area A2 in which the thickness of the semiconductor substrate is smaller than the thickness of the semiconductor substrate in the first area A1 is arranged within the fixing area. When the thickness T2 and the width W2 of the semiconductor substrate 11 in the second area A2 and the thickness T3 of the semiconductor substrate 11 in the third area A3 satisfy the relationships described in the first embodiment, the possibility of deformation and cracking of the semiconductor substrate 11 can further be reduced, thus achieving an image pickup device exhibiting a high reliability. It is desirable that the boundary at which the greatest thickness T1 of the semiconductor substrate 11 starts to decrease be arranged within the fixing area.

Third Embodiment

Figure 7:
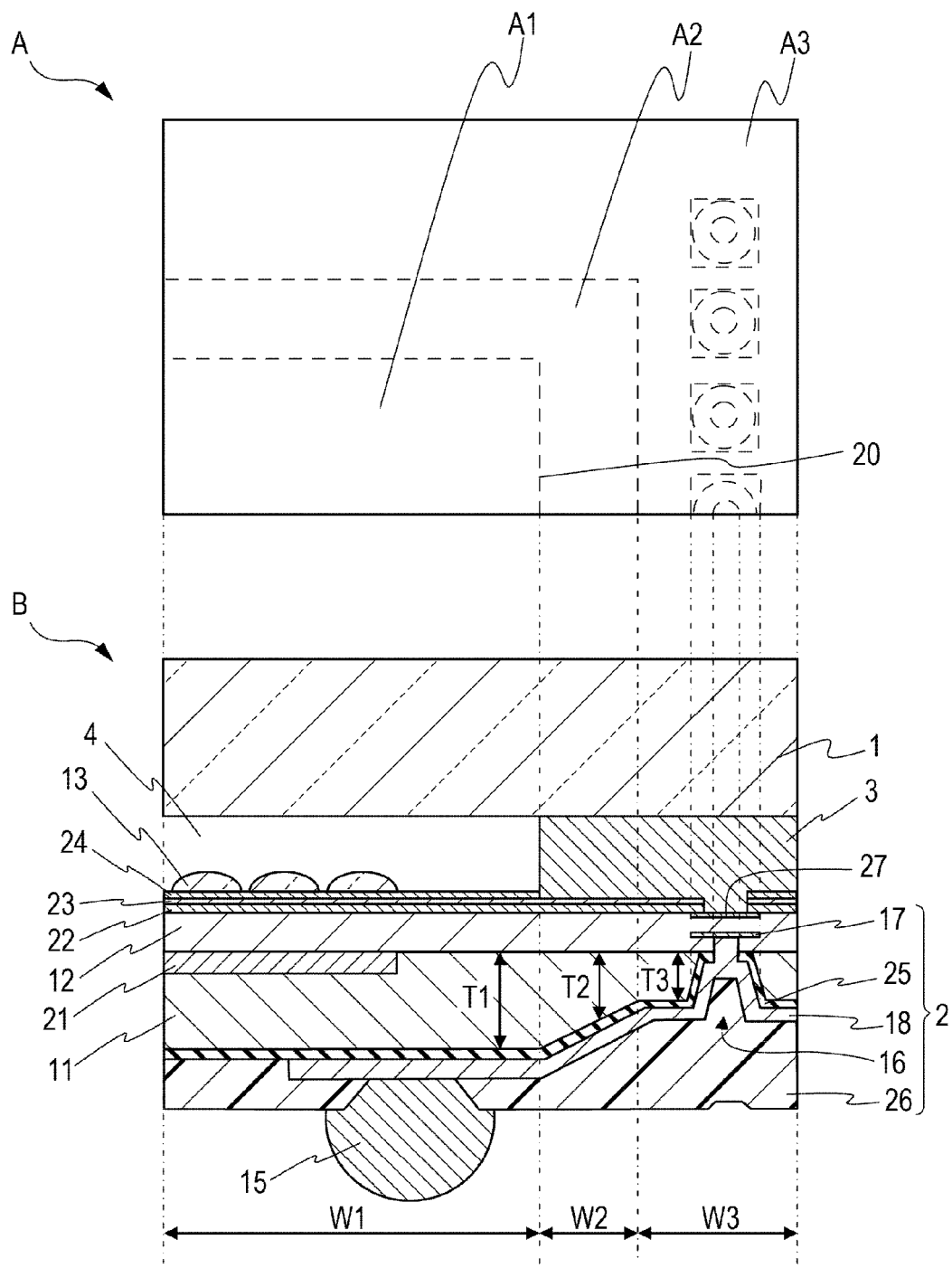
FIG. 7 includes a plan view and a sectional view of part of an image pickup device according to a third embodiment.

FIG. 7 illustrates a modification of the image pickup device according to the first embodiment. Part A and part B of FIG. 7 are a partial plan view and a partial sectional view similar to part A and part B of FIG. 3. The same components as those in FIG. 3 are referred to as the same reference numerals and signs and the explanations of those same components will be omitted.

An image pickup device according to this embodiment is characterized in that a cross section of the semiconductor substrate 11 in the second area A2 has a tapered shape. That is, the image pickup device according to this embodiment has a configuration in which the thickness T3 of the semiconductor substrate 11 in the third area A3 where the penetrating electrode 16 is formed is smaller than the thickness T1 of the semiconductor substrate 11 in the first area, which is a capturing area, and in which the thickness T2 of the semiconductor substrate 11 in the second area A2, which is between the first area A1 and the third area A3, is changed so as to have a tapered shape. A point in that the boundary 20 across which the thickness of the semiconductor substrate 11 changes is arranged within the fixing area in which the fixing member 3 is arranged when the image pickup device is viewed from the light incident side is the same as in the first and second embodiments. That is, the boundary 20 with the second area A2 in which the thickness of the semiconductor substrate is smaller than the thickness of the semiconductor substrate in the first area A1 is arranged within the fixing area. When the thickness T2 and the width W2 of the semiconductor substrate 11 in the second area A2 and the thickness T3 of the semiconductor substrate 11 in the third area A3 satisfy the relationships described in the first embodiment, the possibility of deformation and cracking of the semiconductor substrate 11 can further be reduced, thus achieving an image pickup device exhibiting a high reliability.

Fourth Embodiment
Application to Image Pickup Module

Figure 8:
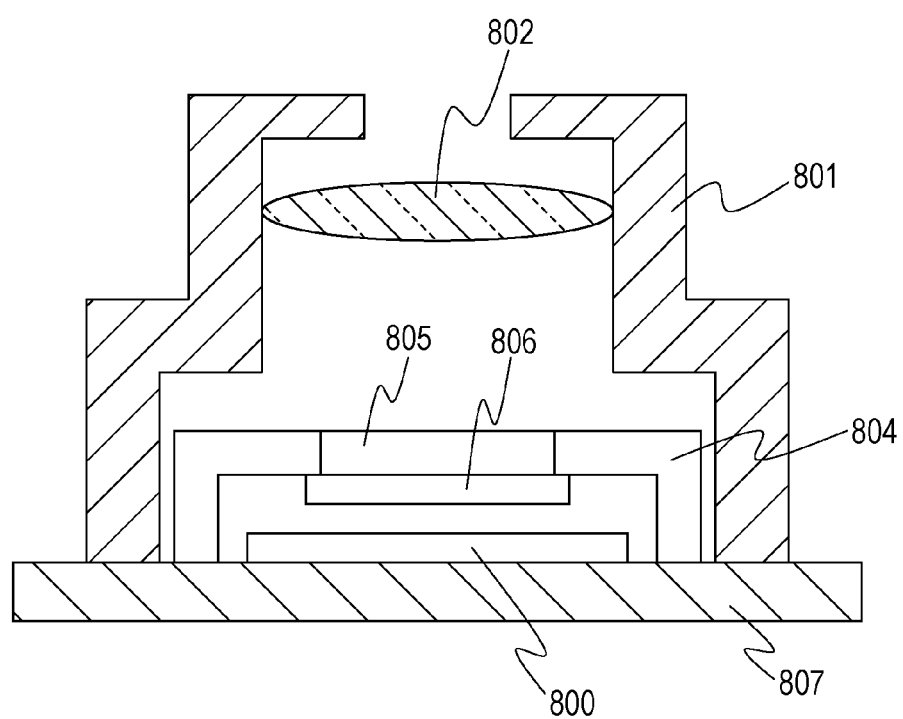
FIG. 8 illustrates an example of a case where an image pickup device is applied to an image pickup module to be used in a portable apparatus.

FIG. 8 illustrates an example of a case where the image pickup device according to the first, second, or third embodiment of the present invention is applied to an image pickup module to be used in a camera.

An image pickup device 800 is installed on a circuit board 807 made of ceramics, silicon, or the like, and the image pickup device 800 is sealed within a cover member 804. The circuit board 807 is electrically connected to the image pickup device 800. An optical portion 805 that captures light and an optical low-pass filter 806 are arranged above the image pickup device 800. Furthermore, the cover member 804 is covered with an image pickup lens 802 and a lens-barrel member 801 fixing the image pickup lens 802, and the cover member 804 is well sealed with the lens-barrel member 801, the image pickup lens 802, and the circuit board 807.

In this application, not only the image pickup device according to an embodiment of the present invention but also an image pickup signal processing circuit, an analog-to-digital (A/D) converter, and a module controller may be installed on the circuit board 807. These units may be formed on the same semiconductor substrate as that of the image pickup device in the same processing step as that in the image pickup device. The optical low-pass filter may be included in the image pickup device and arranged between the transparent member and the image pickup element chip.

Application to Digital Camera

Figure 9:
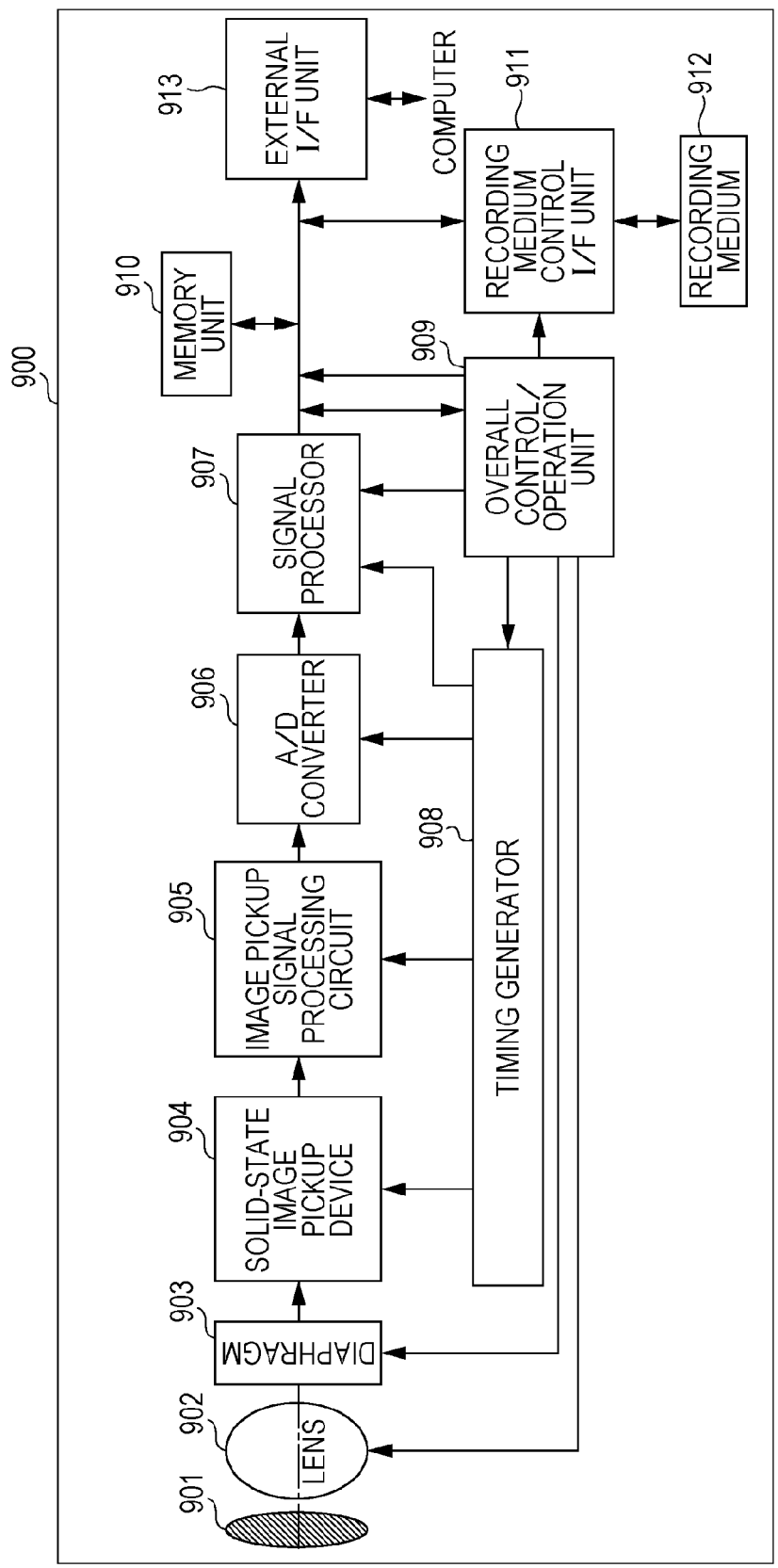
FIG. 9 is a block diagram illustrating a case where an image pickup device is applied to a digital camera, which is an example of an image pickup system.

FIG. 9 is a block diagram illustrating a case where the image pickup device according to the first, second, or third embodiment of the present invention is applied to a digital camera, which is an example of an image pickup system.

A configuration for causing a solid-state image pickup element 904, which is an image pickup device, to capture light includes a shutter 901, an image pickup lens 902, and a diaphragm 903. The shutter 901 controls exposure to the solid-state image pickup element 904. Incident light passes through the image pickup lens 902 and an image is formed on the solid-state image pickup element 904. At this time, the amount of light is controlled by the diaphragm 903.

A signal output from the solid-state image pickup element 904 in accordance with the captured light is processed in an image pickup signal processing circuit 905, and an A/D converter 906 converts an analog signal into a digital signal. The output digital signal is subjected to arithmetic processing in a signal processor 907, and captured image data is generated. The captured image data can be stored in a memory unit 910 arranged in the digital camera and can be transmitted to an external device, such as a computer or a printer, via an external OF unit 913, in accordance with an operation mode set by a user. In addition, the captured image data can be recorded via a recording medium control I/F unit 911 on a recording medium 912 that can be removable from the digital camera.

The solid-state image pickup element 904, the image pickup signal processing circuit 905, the A/D converter 906, and the signal processor 907 are controller by a timing generator 908. The overall system is controlled by an overall control/operation unit 909. Such a system may be formed on the same semiconductor substrate as that of the solid-state image pickup element 904 in the same processing step as that in the solid-state image pickup element 904.

As described above, with the configuration in embodiments of the present invention, the possibility of deformation and cracking of a semiconductor substrate can be reduced, and an image pickup device and an image pickup system exhibiting a high reliability can be provided.

In addition, the embodiments described above can be combined in an appropriate manner and modifications of these embodiments can be made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-186070, filed Aug. 23, 2010, which is hereby incorporated by reference herein in its entirety.

REFERENCE SIGNS LIST 1 transparent member
2 image pickup element chip 3 fixing member
4 space
11 semiconductor substrate
12 wiring structure
13 microlens
14 insulating member
15 soldering ball
16 penetrating electrode
17 internal electrode
18 electroconductive film
19 inner circumference
20 boundary

The invention claimed is:

1. An image pickup device comprising:
a transparent member;
an image pickup element chip including a photodiode; and
a fixing member that is arranged around the image pickup element chip, a space being surrounded by the transparent member, the image pickup element chip, and the fixing member,
wherein the image pickup element chip includes a semiconductor substrate, and the semiconductor substrate includes a penetrating electrode that penetrates through a first main face of the semiconductor substrate on a side of the transparent member and a second main face of the semiconductor substrate opposite the first main face, and wherein in an orthogonal projection that is orthogonal with respect to the transparent member, the penetrating electrode is arranged in a fixing area corresponding to the fixing member, and a boundary with an area in which the thickness of the semiconductor substrate is smaller than the thickness of the semiconductor substrate in a first area corresponding to the space is arranged within the fixing area;
wherein: in the orthogonal projection that is orthogonal with respect to the transparent member, part of the fixing area is defined as a second area, and an area in which the penetrating electrode is arranged is defined as a third area; and the thickness of the semiconductor substrate in the second area is smaller than or equal to the thickness of the semiconductor substrate in the first area and greater than the thickness of the semiconductor substrate in the third area; and
wherein the relationship between the thickness T1 of the silicon substrate in the first area and the thickness T2 of the silicon substrate in the second area and the longitudinal width W1 of the space satisfies expression (1):

$$T1, T2 > 0.009 W1^{1.33} \quad (1).$$

2. The image pickup device according to claim 1 wherein the semiconductor substrate is a silicon substrate and the transparent member is made of glass or optical plastic.

3. The image pickup device according to claim 2, wherein the image pickup element chip has a size corresponding to the size of a Four Thirds chip, and each of the thickness T1 of the silicon substrate in the first area and the thickness T2 of the silicon substrate in the second area is equal to or greater than 0.4 mm.

4. The image pickup device according to claim 2, wherein the image pickup element chip has a size corresponding to the size of an APS-C chip, and each of the thickness T1 of the silicon substrate in the first area and the thickness T2 of the silicon substrate in the second area is equal to or greater than 0.6 mm.

5. The image pickup device according to claim 2, wherein in the orthogonal projection that is orthogonal with respect to the transparent member, the relationship between the thickness T2 and the width W2 of the silicon substrate in the second area satisfies expressions (2) and (3):

$$W2 > 0.3 \text{ mm} \quad (2),$$

$$W2 > 2T2 + 0.2 \text{ mm} \quad (3).$$

6. The image pickup device according to claim 2, wherein the image pickup element chip has a size corresponding to the size of a Four Thirds chip, the thickness T2 of the silicon substrate in the second area is equal to or greater than 0.4 mm, and the width W2 of the silicon substrate in the second area is equal to or greater than 1.0 mm.

7. The image pickup device according to claim 2, wherein the image pickup element chip has a size corresponding to the size of an APS-C chip, the thickness T2 of the silicon substrate in the second area is equal to or greater than 0.6 mm, and the width W2 of the silicon substrate in the second area is equal to or greater than 1.4 mm.

8. The image pickup device according to claim 2, wherein the image pickup element chip has a size corresponding to the size of a $1/2.5$-inch chip, the thickness T2 of the silicon substrate in the second area is equal to or greater than 0.1 mm, and the width W2 of the silicon substrate in the second area is equal to or greater than 0.4 mm.

9. An image pickup module comprising:
the image pickup device according to claim 2;
an optical low-pass filter arranged above the image pickup device; and
a circuit board that is fixed to the image pickup element chip of the image pickup device and that is electrically connected to the image pickup element chip.

10. A camera comprising:
the image pickup device according to claim 2; and
a signal processor a signal obtained by the image pickup device.

11. The image pickup device according to claim 1, wherein:
the semiconductor substrate is a silicon substrate;
the transparent member is made of glass or optical plastic; and
the thickness of the silicon substrate in the third area is smaller than or equal to 0.2 mm.

12. An image pickup module comprising:
the image pickup according to claim 1;
an optical low-pass filter arranged above the image pickup device; and
a circuit board that is fixed to the image pickup element chip of the image pickup device and that is electrically connected to the image pickup element chip.

13. A camera comprising:
the image pickup device according to claim 1; and
a signal processor that processes a signal obtained by the image pickup device.

\* \* \* \* \*